United States Patent
Kobatake

(10) Patent No.: US 8,208,313 B2
(45) Date of Patent: Jun. 26, 2012

(54) STATIC RANDOM ACCESS MEMORY (SRAM) AND TEST METHOD OF THE SRAM HAVING PRECHARGE CIRCUIT TO PRECHARGE BIT LINE

(75) Inventor: Hiroyuki Kobatake, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 176 days.

(21) Appl. No.: 12/461,430

(22) Filed: Aug. 11, 2009

(65) Prior Publication Data
US 2010/0054062 A1    Mar. 4, 2010

(30) Foreign Application Priority Data
Sep. 3, 2008    (JP) .................................. 2008-225880

(51) Int. Cl.
*G11C 7/10*    (2006.01)
(52) U.S. Cl. .............. 365/189.05; 365/230.08; 365/154; 365/205
(58) Field of Classification Search ............. 365/189.05, 365/230.08, 154, 205
See application file for complete search history.

(56) References Cited

U.S. PATENT DOCUMENTS
6,088,820 A * 7/2000 Jyo et al. ........................ 714/718
7,920,409 B1 * 4/2011 Clark et al. .................... 365/154

OTHER PUBLICATIONS

Anne Meixner, et al., "Weak Write Test Mode: An STRAM Cell Stability Design for Test Techniques," International test conference, 1997 IEEE, pp. 1-10.

* cited by examiner

*Primary Examiner* — Jason Lappas
(74) *Attorney, Agent, or Firm* — McGinn Intellectual Property Law Group, PLLC

(57) ABSTRACT

An SRAM includes a memory cell and a precharge circuit. The precharge circuit precharges a bit line pair with a power supply voltage before writing a data in the memory cell or before reading a data therefrom at a time of a normal mode, and which feeds a power supply voltage to at least a low level data-holding node of a node pair of the memory cell at a time of a read test mode, between time for writing a data in the memory cell and time for reading a data therefrom.

13 Claims, 14 Drawing Sheets

STATIC RANDOM ACCESS MEMORY (SRAM) AND TEST METHOD OF THE SRAM HAVING PRECHARGE CIRCUIT TO PRECHARGE BIT LINE

INCORPORATION BY REFERENCE

This application is based upon and claims the benefit of priority from Japanese Patent Application No. 2008-225880 which was filed on Sep. 3, 2008, the disclosure of which is incorporated herein in its entirety by reference.

BACKGROUND OF THE INVENTION

1. Field of the Invention

The present invention relates to SRAM and a method for testing the SRAM.

2. Description of Related Art

FIG. 1 is a diagram showing configurations of a memory cell 100 and peripheral circuits in a general complementary metal-oxide semiconductor (CMOS) type SRAM. Referring to FIG. 1, the memory cell 100 include a positive feedback loop (flip-flop) composed of two CMOS inverters INV10, INV20, and two N-channel MOS transistors N110, N120 for controlling connections between bit line pair BL10, BV20 and the inverters INV10, INV20 (hereinafter referred to as selection transistors N110, N120).

In detail, the two inverters INV10, INV20 are connected between a first power supply VDD and a second power supply (GND). An output of the inverter INV10 is connected to an input of the inverter INV20 through a node ND110. An output of the inverter INV20 is connected to an input of the inverter INV10 through a node ND120. The node ND110 is connected to the bit line BL10 through the selection transistor N110 whose gate is connected to a word line WL100. The node ND120 is connected to the bit line BL20 through the selection transistor N120 whose gate is connected to the word line WL100.

By the word line WL100 being activated, the selection transistors N110, N120 become in ON states, which connects electrically the node pair ND 110, 120 and the bit line pair BL10, BL20, respectively. Thereby, the node pair ND110, 120 holds a voltage supplied from the bit line pair BL10, BL20 (data write). Alternatively, the voltage held by the node pair ND110, 120 is inputted into an un-illustrated sense amplifier through the bit line pair BL10, BL20. The sense amplifier fixes a value of the data by comparing the inputted voltage and a threshold (data read). Thus, writing of the data in the memory cell 100 or reading of the data from the memory cell 100 is performed.

Moreover, before the writing and reading of the data, the bit line pair BL10, BL20 is precharged to a power supply voltage VDD by a precharge circuit 200. The precharge circuit 200 include P-channel MOS transistors P10, P20 (hereinafter referred to as precharge transistors P10, P20) for electrically connecting the first power supply VDD and the bit line pair BL10, BL20 in response to the precharge control signal PRB10 inputted into their gates.

There is a case where even when a read test is performed on the SRAM of this configuration, the memory cell that has a small Static Noise Margin (SNM) and a high fraction defective cannot be detected.

Operations of the read test according to the related technology and their problems will be explained with reference to FIG. 1 and FIG. 2. FIG. 2 is a timing chart showing the operations of the read test according to the related technology.

By time T1, "1" is written in the ND110, and "0" is written in the node ND120. At time T1, by the precharge control signal PRB10 shifting to a low level, the bit line pair BL10, BL20 is precharged to a high level. At time T2, the precharge control signal PRB10 shifts to the high level, and at the same time the word line WL100 is activated and the memory cell is selected. Thereby, a connection between the bit line pair and the first power supply VDD is cut off, and the data written in the memory cell 100 is read.

Between time T2 and time T3 when the word line WL100 is deactivated, a voltage of the node ND120 holding data "0" is pulled up by the bit line BL20 that was precharged to the high level. Here, when the memory cell 100 is normal, a voltage in the node ND120 rises only to a voltage lower than a logic threshold voltage of the inverter INV10. For this reason, the voltage of the node ND120 returns to the low level (data "0") with discharge of the bit line BL20. In this case, the data being read by time T3 becomes the same value as the written data, and it is checked that the memory cell is normal. On the other hand, when the memory cell 100 has abnormality and the voltage in the node ND120 exceeds the logic threshold voltage of the inverter INV10, data different (inverted) from the data that was written in advance is read (not illustrated). In this case, the memory cell concerned is determined to be an abnormal memory cell.

However, there is a case where even when the memory cell 100 has the abnormality, the voltage in the node ND120 rises only to a voltage lower than the logic threshold voltage of the inverter INV10, and the written data is not inverted. This is because when the data is read, the bit line BT20 is discharged, and accordingly the electric charges of the bit line are released faster than the voltage elevation of the node ND120. Thus, there is a case where even when the memory cell 100 has the abnormality, the data whose value is the same as that of the written data is read and it is determined to be no error (normal).

At the times T3 to T5, operations of the times T1 to T3 are repeated.

As in the above, there is a case where even when the SNM is inspected by the read test by the related technology, the abnormality of the memory cell cannot be detected. A circuit for testing that solves such a problem is described, for example, in Anne Meixner, Jash Banik, "Weak Write Test Mode: An SRAM Cell Stability Design for Test Technique," International test conference, 1997 (Nonpatent Document 1).

Operations of the read test using the circuit for testing described in Nonpatent Document 1 will be explained with reference to FIG. 3 and FIG. 4. FIG. 3 is a diagram showing configurations of the memory cell 100 and peripheral circuits (the precharge circuit 200, and a circuit 300 for testing) described in Nonpatent Document 1. FIG. 4 is a timing chart showing operations of the read test using the circuit 300 for testing described in Nonpatent Document 1.

From a test start time to time T2, the circuit 300 for testing performs the same operations as those of the related art shown in FIG. 2. At time T2, the precharge control signal PRB10 shifts to the high level, and at the same time the word line WL100 is activated and the memory cell is selected. In doing this, the control signal inputted into the circuit 300 for testing becomes the high level and the control signal WR1 becomes the low level, whereby a voltage of the bit line BL20 is pulled up to the high potential side by the first power supply VDD and a voltage of the bit line BL10 is pulled down to the low potential side by the GND.

By the voltage of the node N120 being pulled up and by the voltage of the node N110 being pulled down, the logic threshold voltage of the inverter INV10 is pulled down from an actual value, and a logic threshold voltage of the inverter INV20 is pulled up. That is, the data that has been held by the node pair N110, N120 with the circuit 300 for testing becomes a state of being easily inverted. For this reason, even in the case of the abnormal memory cell such that the data would not be inverted by the related technology, it is possible to detect the abnormality because the written data is inverted by a connection of the bit line BT20 being precharged. Here, the circuit 300 for testing is configured that the node voltage is pulled up or pulled down so that inversion of the data may not occur in the case of a normal memory cell. Therefore, according to the method described in Nonpatent Document 1, it becomes possible to detect the abnormal memory cell that has a small SNM and cannot be detected by the related technology.

SUMMARY

However, according to the technique described in Nonpatent Document 1, since the circuit 300 for testing is newly added, the whole circuit area of a semiconductor storage device will increase. Because of this, a technique of detecting the memory cell that has a small SNM and a high probability of fraction defective without increasing the circuit area is sought for.

A static random access memory (SRAM) of an exemplary aspect of the present invention includes a memory cell having a node pair that is electrically connected to a bit line pair by activation of a word line, and a precharge circuit which precharges the bit line pair with a power supply voltage before writing a data in the memory cell or before reading a data therefrom at a time of a normal mode, and which feeds the power supply voltage to at least a low level data-holding node of the node pair at a time of a read test mode, between time for writing a data in the memory cell and time for reading a data therefrom.

In the exemplary aspect, the SNM of the memory cell is forcibly made small by biasing a voltage of the node for holding the voltage of a low level with the precharge circuit. In doing this, when held data is not inverted, the precharge circuit determines that it is a normal memory cell whose SNM is sufficiently large, while the held data is inverted, the precharge circuit determines that it is an abnormal memory cell whose SNM is smaller than a desired magnitude. Thus, in the present invention, it is possible to improve detection sensitivity of the abnormal memory cell with the precharge circuit. Moreover, since the precharge circuit is a circuit used for normal operations (writing and reading of data), a circuit area does not increase.

According to the exemplary aspect, it is possible to improve the detection sensitivity of the abnormal memory cell whose SNM is small while controlling increase in the circuit area of the SRAM.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

1. First Exemplary Embodiment

A first exemplary embodiment of SRAM and a read test method of the SRAM according to the present invention will be described with reference to FIG. 5 and FIG. 6.

(Configuration of SRAM)

Figure 5:
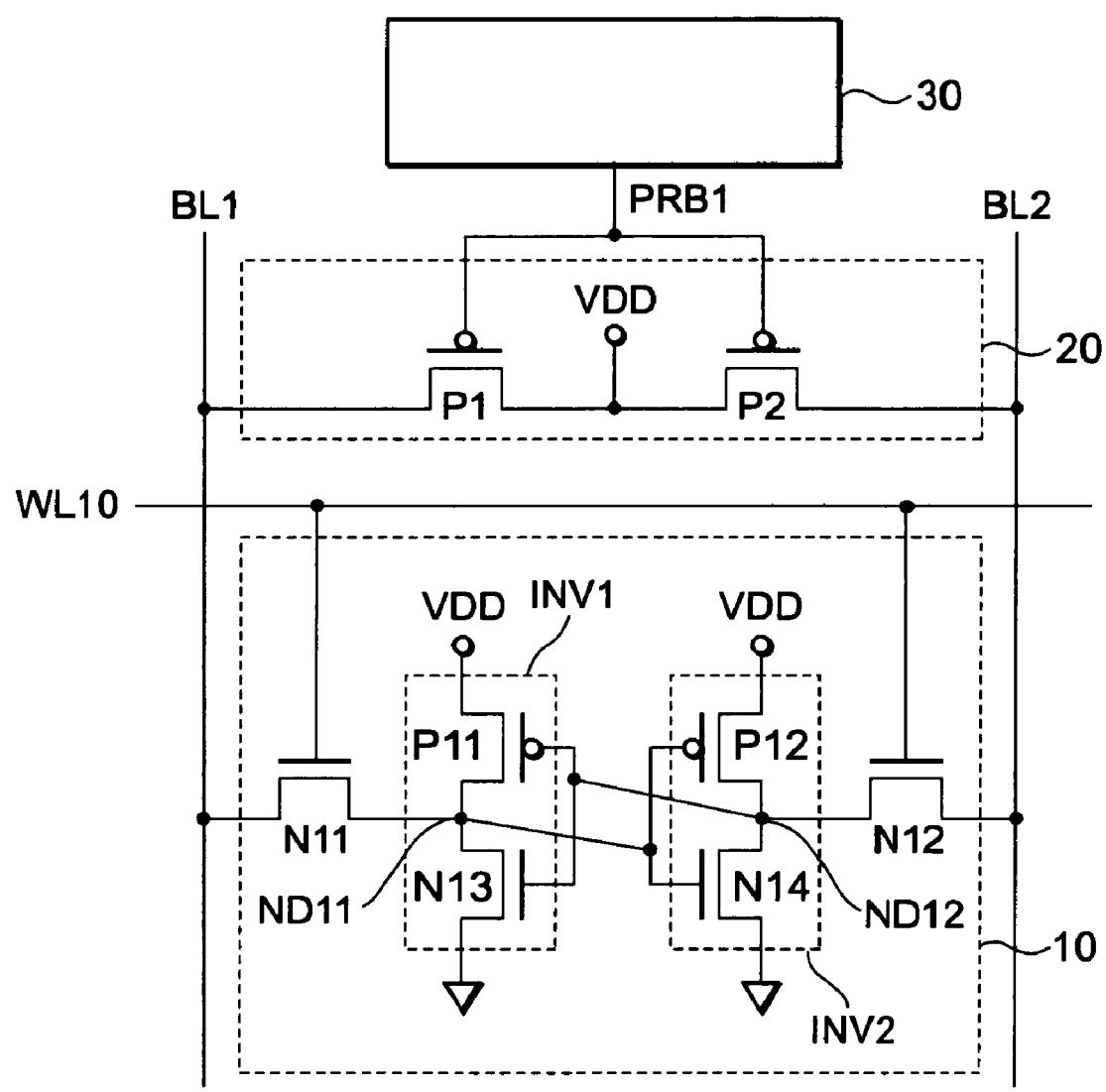
FIG. 5 is a diagram showing a part of a configuration of a first exemplary embodiment of the SRAM according to the present invention.
Figure 6:
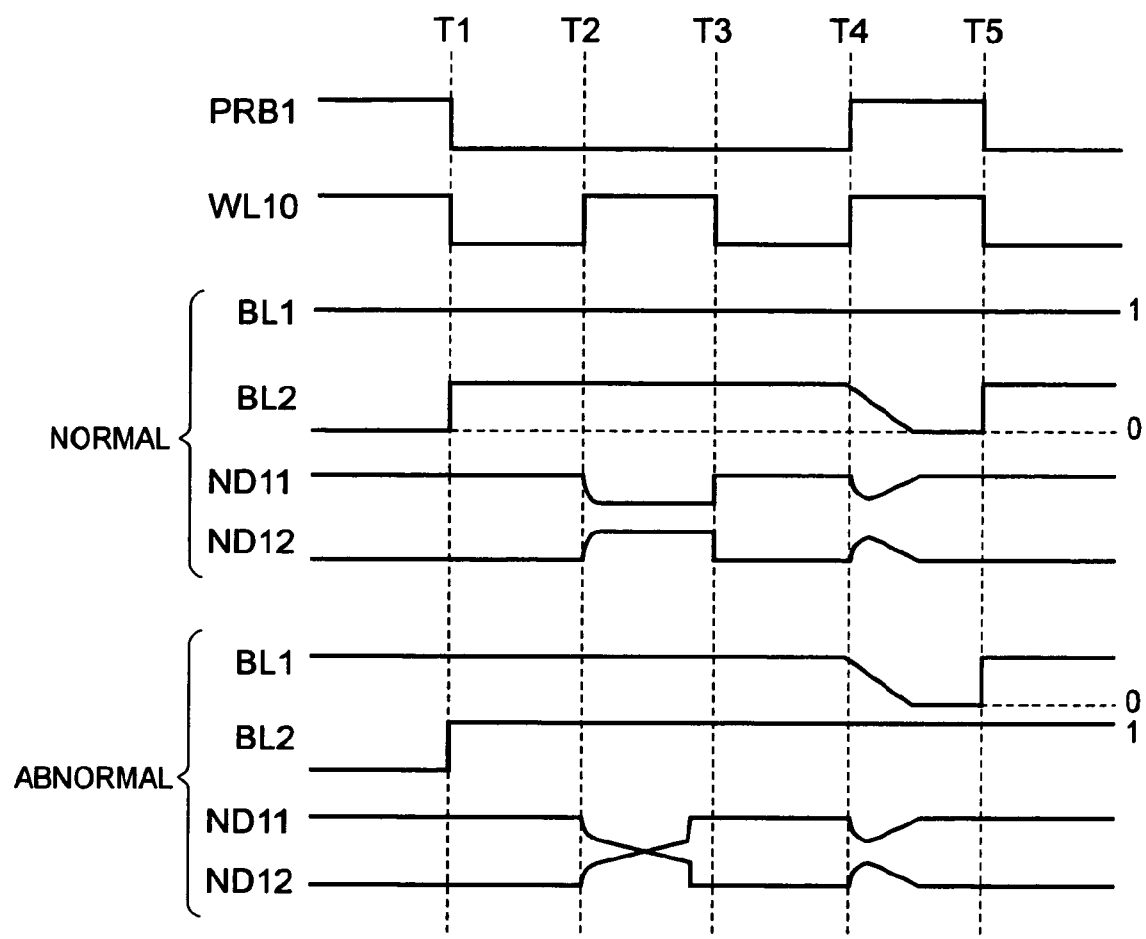
FIG. 6 is a timing chart showing operations of the read test of the SRAM in the first exemplary embodiment.

FIG. 5 is a diagram showing a part of a configuration of the SRAM in the first exemplary embodiment. The SRAM includes a memory cell 10 connected to the bit line pair BL1, BL2 and the word line WL10, a precharge circuit 20 for precharging the bit line pair BL1, BL2, and a precharge control circuit 30 for controlling the precharge circuit 20. The precharge control circuit 30 also controls the precharge circuit connected to an other bit line pair being not illustrated.

Referring to FIG. 5, the memory cell 10 include a positive feedback loop (a flip-flop) that includes two CMOS inverters INV1, INV2 and, two N-channel MOS transistors N11, N12 (hereinafter referred to as selection transistors N11, N12) for controlling a connection between the bit line pair BL1, BV2 and the inverters INV1, INV2.

In detail, the two inverters INV1, INV2 are connected between a first power supply VDD and a second power supply (GND). The inverter INV1 includes a P-channel MOS transistor P11 and an N-channel MOS transistor N13 that are connected through a node ND11. The inverter INV2 includes a P-channel MOS transistor P12 and an N-channel MOS transistor N14 that are connected through a node ND12. An output of the inverter INV1 is connected to an input of the inverter INV2 through the node ND11, and an output of the inverter INV2 is connected to an input of the inverter INV1 through the node ND12. The Node ND11 is connected to the bit line BL1 through the selection transistor N11 whose gate is connected to the word line WL10, and the node ND12 is connected to the bit line BL2 through the selection transistor N12 whose gate is connected to the word line WL10.

By the word line WL10 being activated, the selection transistors N11, N12 become ON state, and the node pair ND11, 12 and the bit line pair BL1, BL2 are electrically connected. Thereby, the node pair ND11, 12 holds the voltage supplied from the bit line pair BL1, BL2 (data write). Alternatively, the voltage held by the node pair ND11, 12 is inputted into an unillustrated sense amplifier through the bit line pair BL1, BL2. The sense amplifier fixes (data read) a value of the data by comparing the inputted voltage and the threshold. Thus, the writing of data in the memory cell 10 or the reading of the data from the memory cell 10 is performed.

The precharge circuit 20 includes a P-channel MOS transistor P1 connected between the first power supply VDD and the bit line BL1, and a P-channel MOS transistor P2 connected between the first power supply VDD and the bit line BL2. Below, the P-channel MOS transistors P1, P2 are called precharge transistors P1, P2. The precharge transistor P1 controls electric connection between the bit line BL1 and the first power supply VDD in response to the precharge control signal inputted into its gate. The precharge transistor P2 controls electric connection between the bit line BL2 and the first power supply VDD in response to the precharge control signal inputted into its gate. In the case of the test mode, a common precharge control signal PRB1 is inputted into the precharge transistors P1, P2 in the first exemplary embodiment, so that the precharging to the bit line pair BL1, BL2 is simultaneously performed.

In the case of a normal mode, similarly with the related technology, before the data is written in or read from the memory cell, the precharge control circuit 30 outputs a low level precharge control signal, and shifts the precharge control signal to a high level at the time of writing and reading of the data. Thereby, the precharge circuit 20 precharges the bit line pair BL1, BL2 before the writing and reading of the data. On the other hand, in a read test mode, the precharge control circuit 30 performs a control different from the normal mode. Details of the operations in the read test mode will be described later. At the time of the test mode, the precharge control circuit 30 may output the precharge control signal in response to the control signal from an external test device (not illustrated).

In the SRAM in the first exemplary embodiment, in the case of the test mode, the voltage of a node pair ND11, ND12 is pulled up by the precharge circuit 20, and the threshold voltage of the inverter in the memory cell 10 is reduced intentionally. Thereby, it is possible to detect an abnormal memory cell that cannot be detected by the related technology.

(Operations in Test Mode)

Details of operations of the SRAM in the test mode in the first exemplary embodiment will be explained with reference to FIG. 6. FIG. 6 is a timing chart showing the operations of the read test of the SRAM in the first exemplary embodiment.

In the test mode, writing of data(up to time T1), precharging of the bit line (time T1 to time T2), SNM reduction processing (time T2 to time T3), precharging of the bit line for data reading (time T3 to time T4), reading of the data (time T4 to time T5), and determination of existence/absence of abnormality (time T5 and after) are performed.

First, by time T1, "1" (the high level) is written in the node ND11 and "0" (a low level) is written in the node ND12. In doing this, the precharge circuit 20 cuts off a connection between the first power supply VDD and the bit line pair BL1, BL2 in response to the precharge control signal PRB1 of the high level, like in the normal mode. At time T1, the precharge control signal PRB1 shifts to the low level, and the word line WL10 is deactivated. Thereby, the memory cell 10 is disconnected from the bit line pair BL1, BL2, and the bit line pair BL10, BL20 is precharged to the high level by the precharge circuit 20.

At time T2, the precharge control signal PRB1 maintains the low level, and the word line WL10 is activated. Thereby, a power supply voltage VDD is fed to the node pair ND11, ND12 from the precharge circuit 20 through the bit line pair BL1, BL2. The feed of the voltage to the node pair ND11, ND12 by the precharge circuit 20 is being done until the word line WL10 is deactivated at time T13. Between time T2 and time T3, a voltage of the node ND12 is pulled up from the low level "0" by a predetermined voltage by the precharge circuit 20. Accompanying with this, a voltage of the node ND11 decreases from the high level "1" by a predetermined voltage.

Here, when the memory cell is normal, the voltage of the node ND12 becomes constant at a value lower than a logic threshold voltage of the inverter INV1, and the voltage of the node ND11 becomes constant at a value higher than a logic threshold voltage of the inverter INV2. That is, even when there is the feed of the voltage from the precharge circuit 20, inversion of the written data does not occur.

On the other hand, in the case of the memory cell that has a small SNM and a high fraction defective, the logic threshold voltage of the inverter INV1 or the inverter INV2 shows a value different from a normal value. For this reason, as compared with a normal memory cell, the voltage of the node ND12 becomes easy to exceed the logic threshold voltage of the inverter INV1. Alternatively, the voltage of the node ND11 becomes easy to fall below the logic threshold voltage of the inverter INV2. If the high voltage (the power supply power supply voltage VDD) is impressed to the memory cell in this state from the precharge circuit 20, then the value of the data written in the memory cell 10 will be inverted. For example, in the case where the N-channel MOS transistor N14 is of higher resistance than the normal one, the voltage of the node ND12 is pulled up to be larger than that of the normal memory cell and exceeds the logic threshold voltage of the inverter INV1. Moreover, also in the case where the selection transistor N12 is of lower resistance than the normal one, the voltage of the node ND12 is pulled up to be larger than that of the normal memory cell similarly and exceeds the logic threshold voltage of the inverter INV1. Furthermore, in the case where the P-channel MOS transistor P11 is of higher resistance than the normal one, a logic threshold voltage of the node ND12 will lower and the voltage of the node ND12 will exceed the logic threshold voltage of the inverter INV1. In the above case, the data held by the node pair ND11, ND12 will be inverted.

From time T3 to time T4, a precharge processing of the reading processing of the data is performed. In detail, the precharge control signal PRB1 maintains the low level, and the word line WL10 is deactivated. Thereby, the precharge circuit 20 precharges the bit line pair BL1, BL2 to the high level. Between a continuing time T4 and time T5, the data is read from the memory cell 10. Here, the precharge control signal PRB1 shifts to the high level, and at the same time the word line WL10 is deactivated. Thereby, the first power supply VDD and the bit line pair BL1, BL2 are disconnected, and the data is read from the memory cell 10.

When the data read from the memory cell 10 between time T4 and time T5 and the data written by time T1 agree with each other, it is determined that the memory cell 10 is normal. When the two differ from each other, it is determined that it has the abnormality.

In the present invention, the SNM of the memory cell 10 is forcibly made small by impressing a high voltage to the node pair BL1, BL2 with the precharge circuit after the writing of the data. Here, when the SNM is the normal value, held data is not inverted even when the SNM becomes small. On the other hand, in the case of the abnormal memory cell whose SNM is smaller than a desired magnitude and that is not detected by the related method, since the SNM becomes further smaller by the precharge circuit 20, the held data will be inverted. Thus, it is possible to improve detection sensitivity of the abnormal memory cell by making the SNM small with the precharge circuit 20.

In the above-mentioned operations of detecting the abnormal memory cell, although the node ND11 is made to hold data "1" and the node ND12 is made to hold data "0," but in contrast to this, inverted data may be written therein. That is, by time T1, the node ND11 is made to hold data "0" and the node ND12 is made to hold data "1," and the read test may be performed by doing the same operations as described above. In this case, the abnormal memory cell whose N-channel MOS transistor N13 is of high resistance, the abnormal memory cell whose selection transistor N11 is of low resistance, and the abnormal memory cell whose P-channel MOS transistor P12 is of high resistance can be detected.

In the SRAM according to the present invention, a voltage of the node holding data "0" (the low level) is not pulled up only by electric charges charged in the bit line capacitance, but is raised (is biased) additionally by the power supply voltage VDD. For this reason, it is possible to improve the detection sensitivity of the abnormal SRAM that cannot be detected (cannot be eliminated) by the read test according to the related technology by making further smaller the SNM.

Moreover, a change from the related technology shown in SRAM to the SRAM according to the present invention lies only in operations of the precharge control circuit (precharge control signal at time T2 to time T3). For this reason, it is possible to perform a test capable of detecting the abnormal memory cell whose SNM is small without altering the memory cell and the precharge circuit. That is, according to the present invention, it is possible to improve the abnormality detection sensitivity of the SRAM without increasing a circuit area.

2. Second Exemplary Embodiment

Figure 7:
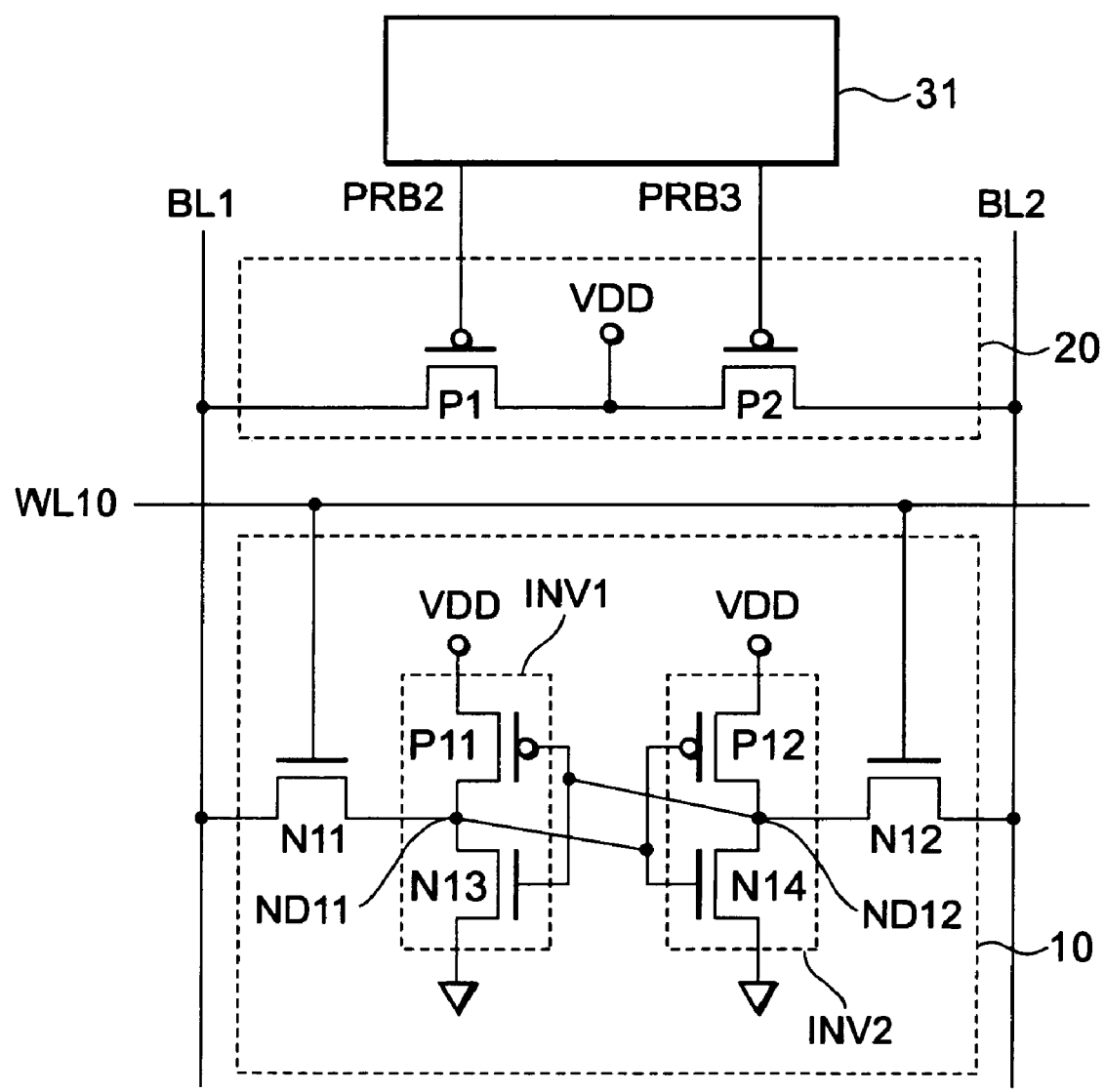
FIG. 7 is a diagram showing a part of a configuration in a second exemplary embodiment of the SRAM according to the present invention.

FIG. 7 is a diagram showing a part of a configuration of the SRAM in a second exemplary embodiment. In the SRAM in the first exemplary embodiment, at the time of the test mode, the precharge circuit 20 is controlled by the precharge control signal PB1 whose signal level changes at the same timing. Thereby, the bit line pair BL1, BL2 was biased with the power supply voltage VDD, and the data of the abnormal memory cell was forcibly inverted. On the other hand, in the SRAM in the second exemplary embodiment, at the time of the test mode, the precharge transistors P1, P2 are controlled by the respective precharge control signals PB2, PB3 whose signal levels change at different timings.

(Configuration of SRAM)

Referring to FIG. 7, the SRAM in the second exemplary embodiment includes a precharge control circuit 31 instead of the precharge control circuit 30 in the first exemplary embodiment. In the case of the test mode, the precharge control circuit 31 controls the operations of the precharge circuit 20 by outputting two precharge control signals PRB2, PRB3 to the precharge circuit 20. The precharge transistor P1 controls a connection between the first power supply VDD and the bit line BL1 in response to a precharge control signal PRB2 inputted into its gate. The precharge transistor P2 controls a connection between the first power supply VDD and the bit line BL2 in response to a precharge control signal PRB3 inputted into its gate. Since other configurations are the same as those of the first exemplary embodiment, explanations thereof will be omitted. In addition, in the case of the normal mode, the precharge control circuit 31 operates similarly with the precharge control circuit 30 in the first exemplary embodiment.

(Operations in Test Mode)

Figure 8:
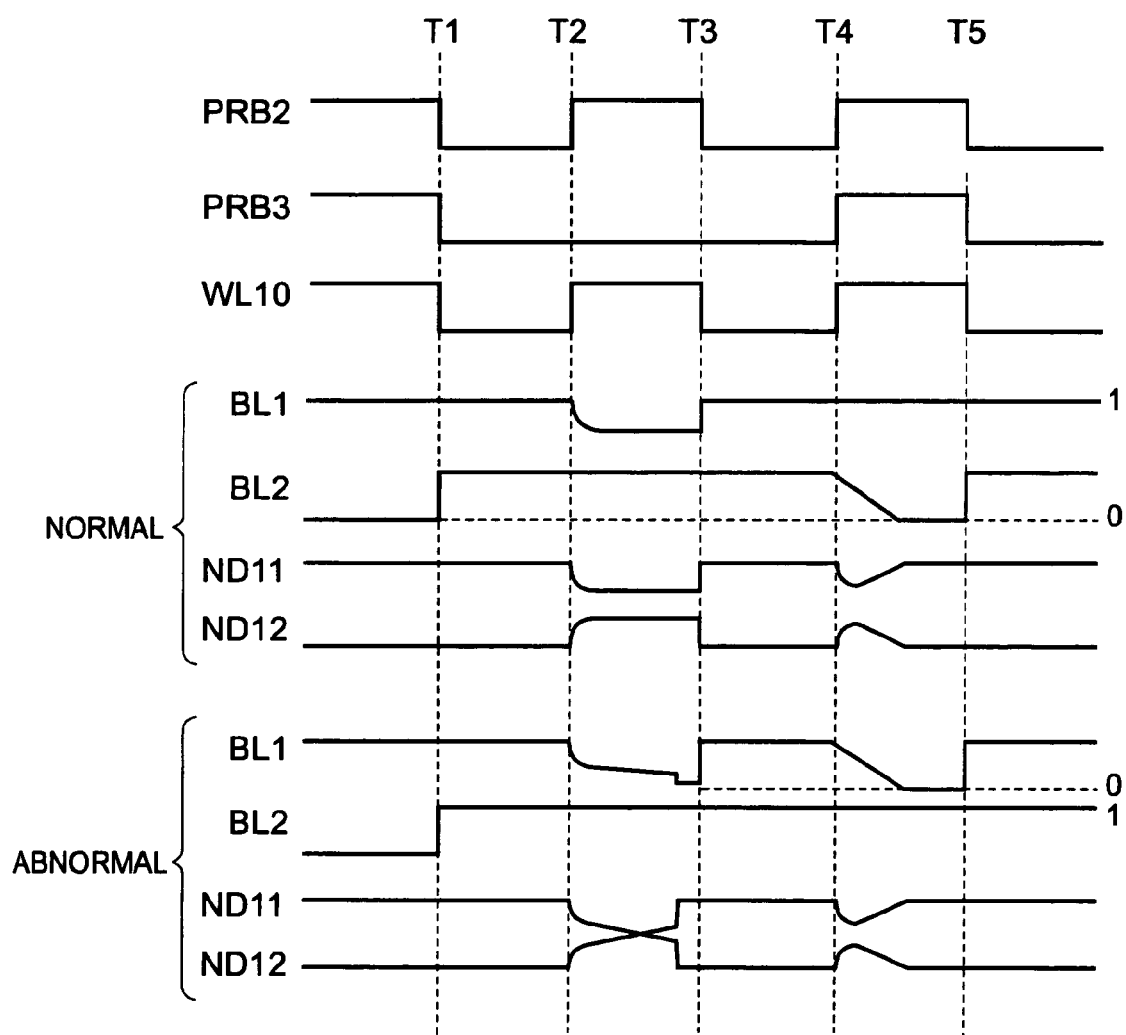
FIG. 8 is a timing chart showing operations of the read test of the SRAM in the second exemplary embodiment.

Details of operations of the SRAM in the test mode in the second exemplary embodiment will be explained with reference to FIG. 8. FIG. 8 is a timing chart showing the operations of the read test of the SRAM in the second exemplary embodiment.

In the test operations of this exemplary embodiment, only parts thereof from time T2 to time T3 are different from those of the first exemplary embodiment, the operations at the other times are the same. For this reason, below, only the parts of the operations from time T2 to time T3 will be explained, and the operations at the other times will be omitted.

At time T2, the precharge control signal PRB2 shifts to the high level, and the precharge control signal PRB2 maintains the low level. Moreover, the word line WL10 is activated. Thereby, the power supply voltage VDD is fed to the node ND12 from the precharge circuit 20 through the bit line pair BL2. The feed of the voltage to the node ND12 by the precharge circuit 20 is being done until the word line WL10 is deactivated at time T3. That is, the precharge circuit 20 feeds the power supply voltage to the node ND12 between time T2 and time T3, while intercepting the feed of the power supply voltage to the node ND11. Moreover, since the first power supply VDD and the bit line BL1 are being disconnected by the precharge circuit 20, the power supply voltage VDD is not fed to the node ND11. For this reason, the node ND11 releases electric charges through the bit line BL11.

Between time T2 and time T3, the voltage of the node ND12 is pulled up by the precharge circuit 20 from the low level "0" by a predetermined voltage. On the other hand, although the voltage of the node ND11 decreases from the high level "1" by a predetermined voltage, since the voltage of the node ND11 is not pulled up by the precharge circuit 20, the voltage of the node ND11 decreases more largely than that of the first exemplary embodiment. For this reason, between time T2 and time T3 in the second exemplary embodiment, the data becomes a state of being easily inverted than in the first exemplary embodiment. That is, the SRAM in the second exemplary embodiment can improve the detection sensitivity of the abnormal memory cell better than the SRAM in the first exemplary embodiment.

Moreover, by writing the reverse data (inverted data) of the written data shown in FIG. 8 in the memory cell 10 and performing the read test, it is possible to detect abnormality of an other element that is not detected by the above-mentioned test. In this case, data "0" is written in the node ND11, data "1" is written in the node ND12, and then the read test is performed. Moreover, from time T2 to time T3, the precharge control signals PRB2, PRB3 whose signal levels are inverted to the one example shown in FIG. 8 are inputted into the precharge circuit 20. Thereby, between time T2 and time T3, the power supply voltage VDD is fed to the node ND11 holding data "0" from the bit line BL1, and the electric charges are released to the bit line BL2 from the node ND12. By doing the operations this way, it is possible to detect the abnormality of the other element in the memory cell 10.

In also the SRAM in the second exemplary embodiment, similarly with the first exemplary embodiment, the voltage of the node holding data "0" (the low level) is not pulled up only by the electric charges charged in the bit line capacitance, but is raised (is biased) additionally by the power supply voltage VDD. For this reason, it becomes possible to detect (eliminate) the abnormal SRAM that cannot be detected (eliminated) by the read test according to the related technology although the SNM is small and the fraction defective is high.

Figure 1:
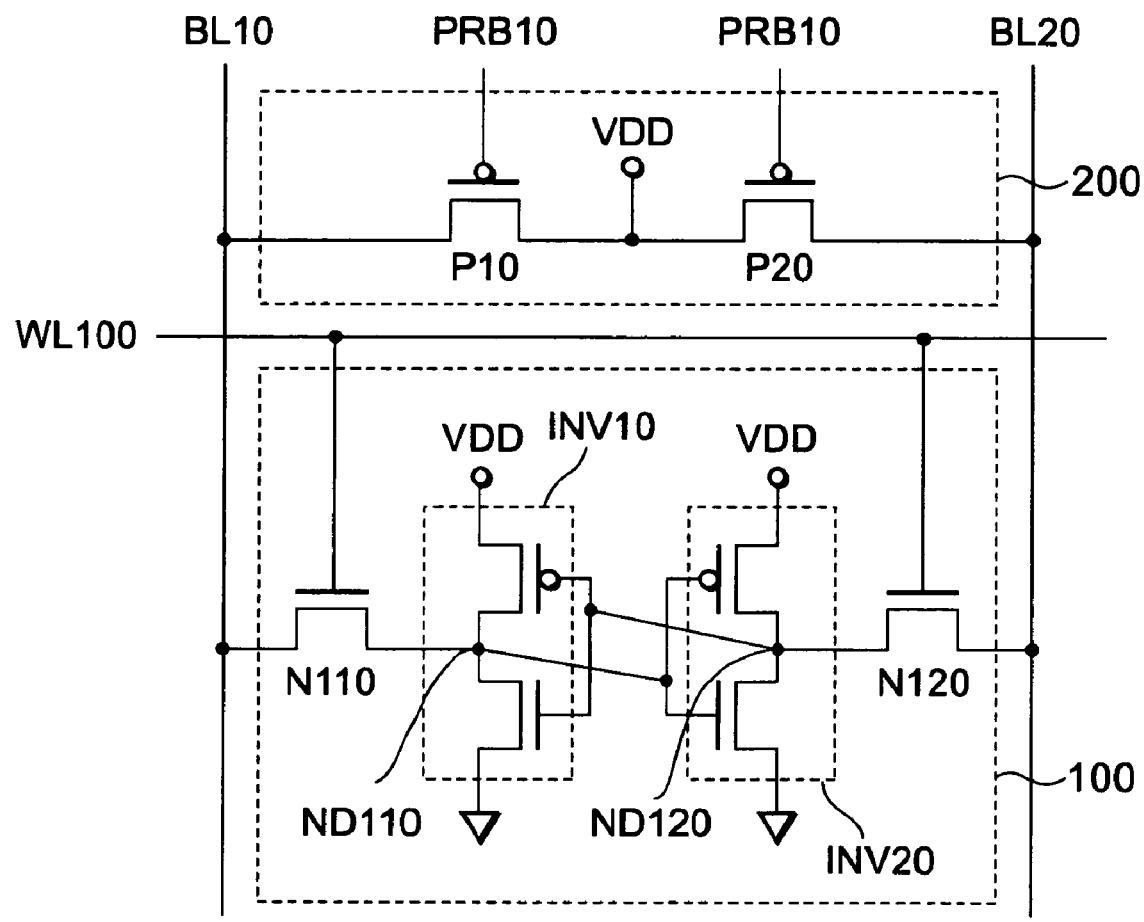
FIG. 1 is a diagram showing one example of a configuration of SRAM according to a related technology.
Figure 2:
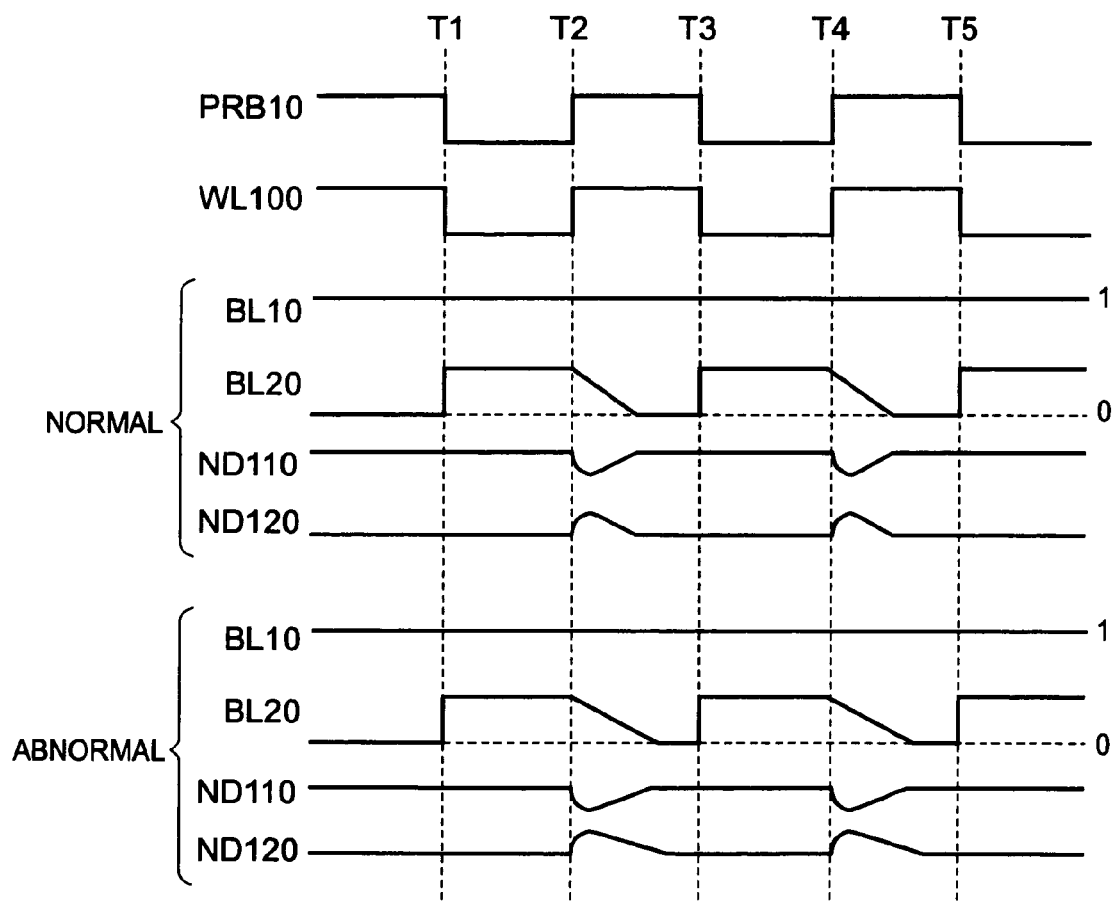
FIG. 2 is a timing chart showing one example of a read test of the SRAM according to the related technology.
Figure 3:
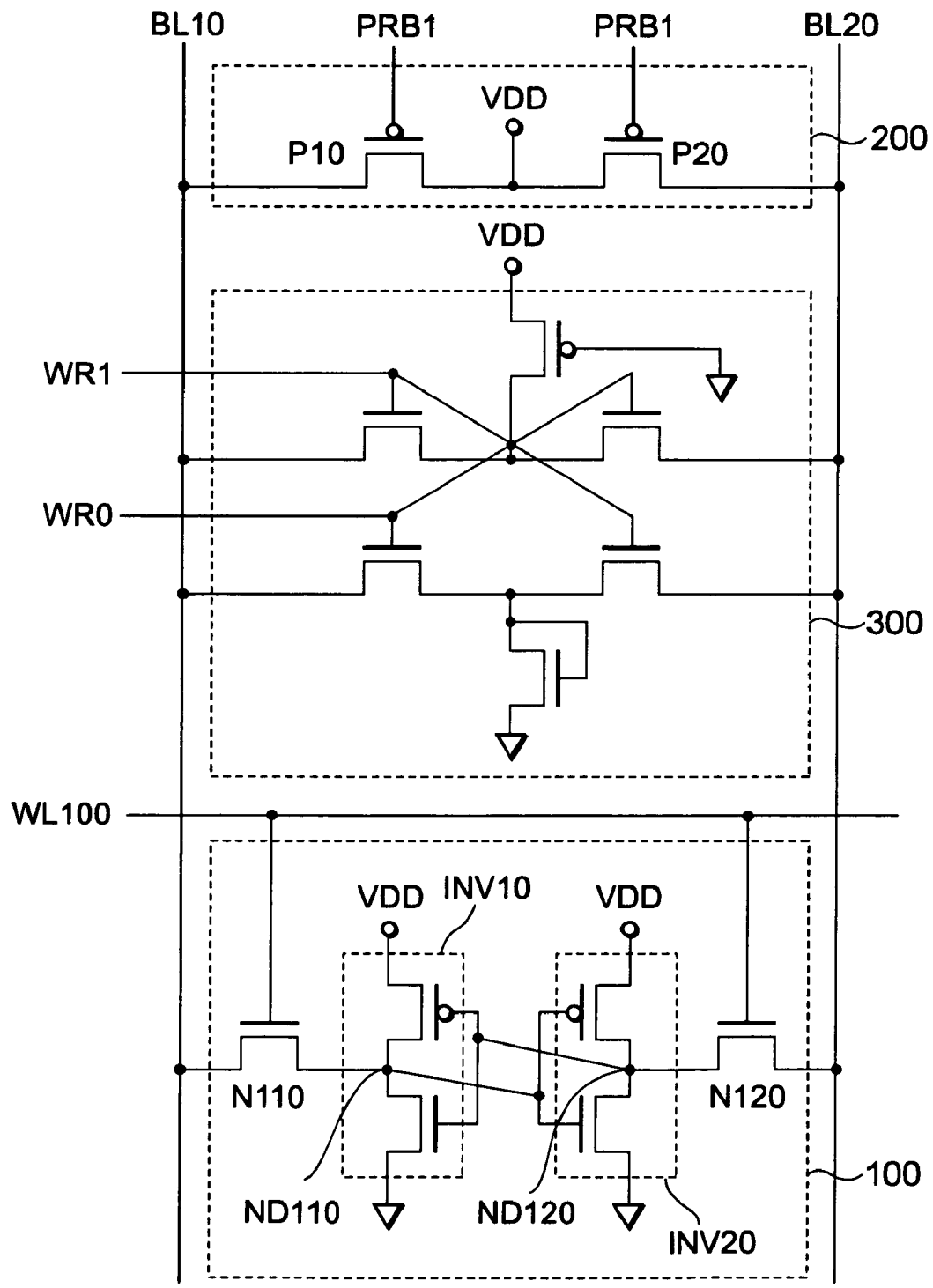
FIG. 3 is a diagram showing one other example of the configuration of the SRAM according to the related technology.
Figure 4:
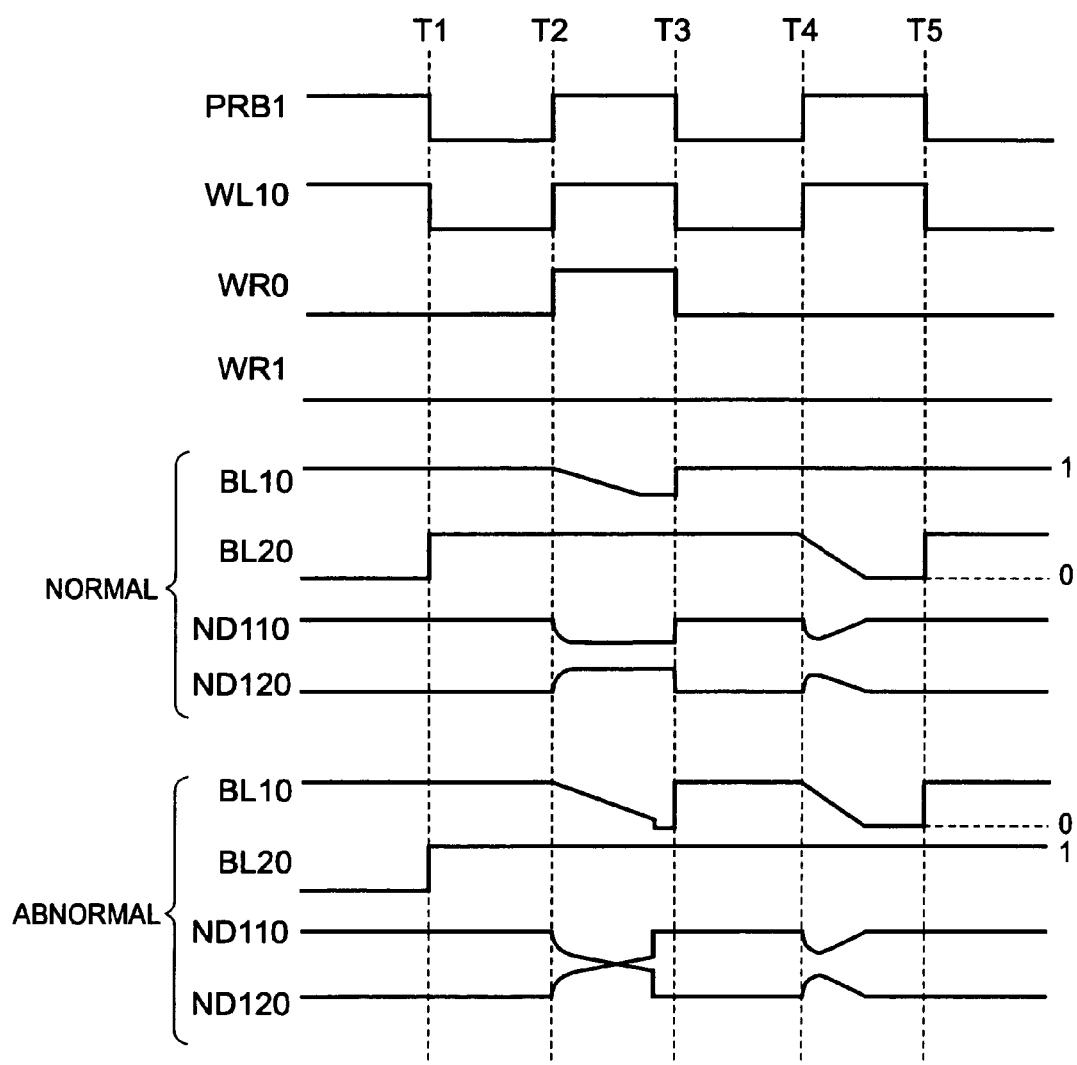
FIG. 4 is a timing chart showing one other example of the read test of the SRAM according to the related technology.

Moreover, similarly with the first exemplary embodiment, a change of the SRAM of the second exemplary embodiment from the related technology shown in FIG. 1 lies in only operations of the precharge control circuit in the test mode (the precharge control signal at time T2 to time T3). For this reason, it is possible to perform the test capable of detecting the abnormal memory cell whose SNM is small without altering the memory cell and the precharge circuit.

3. Third Exemplary Embodiment

Figure 9:
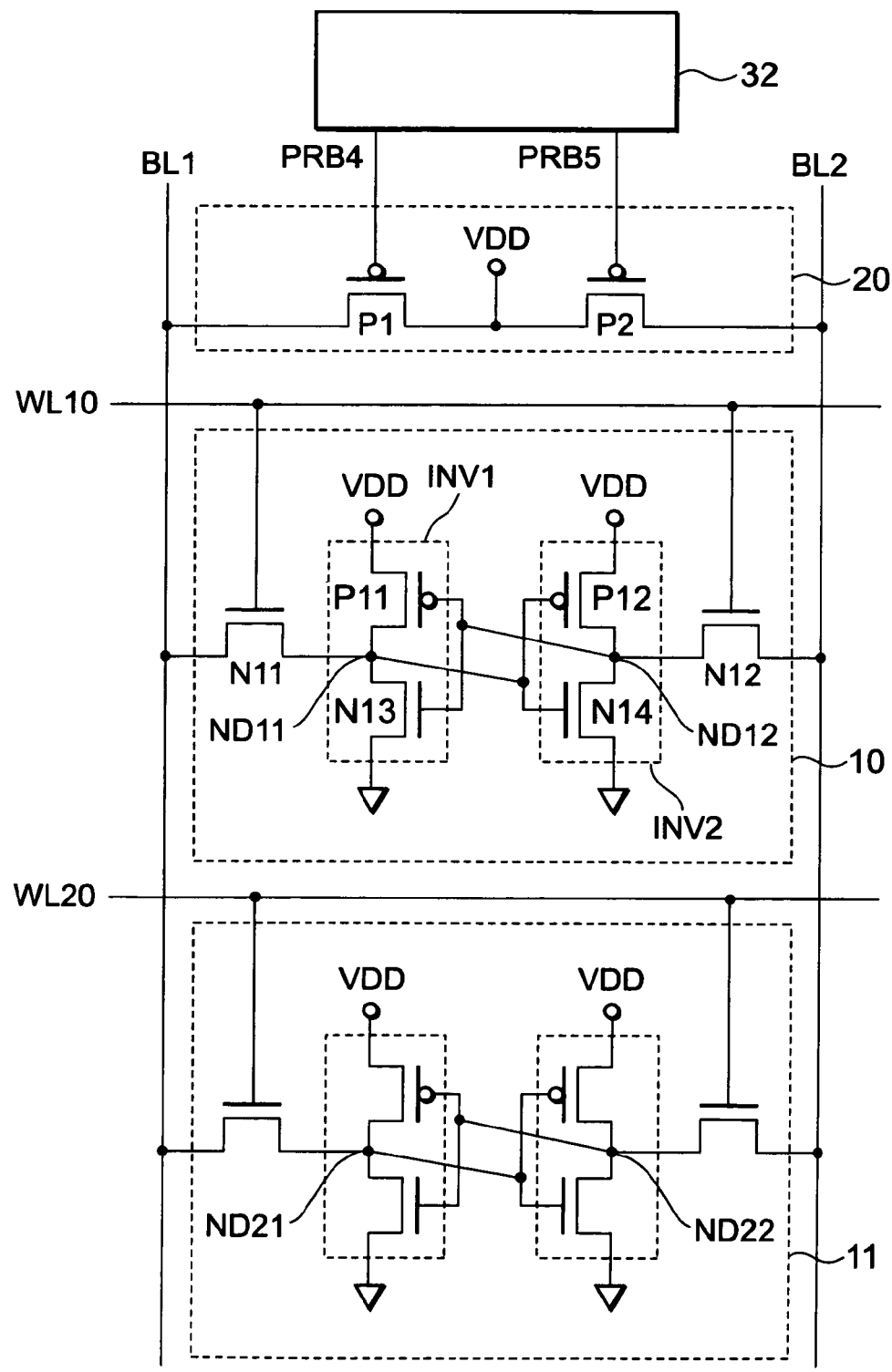
FIG. 9 is a diagram showing a part of a configuration in a third exemplary embodiment of the SRAM according to the present invention.

FIG. 9 is a diagram showing a part of a configuration of the SRAM in a third exemplary embodiment. In the SRAM in the first exemplary embodiment, at the time of the test mode, the precharge circuit 20 is controlled by the precharge control signal PB1 whose signal level changes at the same timing. Thereby, the bit line pair BL1, BL2 was biased with the power supply voltage VDD, and the data of the abnormal memory cell was forcibly inverted. On the other hand, in the SRAM in the third exemplary embodiment, at the time of the test mode, the precharge transistors P1, P2 are controlled by the respective precharge control signals PB4, PB5 whose signal levels change at different timings. Moreover, by decreasing the voltage of one of the node pair using the data that is written in an other memory cell connected to the same bit line pair, the SRAM can be made to be SRAM that has further higher detection sensitivity of the abnormality.

(Configuration of SRAM)

Referring to FIG. 9, the SRAM in the third exemplary embodiment includes a precharge control circuit 32 instead of the precharge control circuit 30 in the first exemplary embodiment. In the test mode, the precharge control circuit 32 controls operations of the precharge circuit 20 by outputting two precharge control signals PRB4, PRB5 to the precharge circuit 20. The precharge transistor P1 controls a connection between the first power supply VDD and the bit line BL1 in response to a precharge control signal PRB4 inputted into its gate; the precharge transistor P2 controls a connection between the first power supply VDD and the bit line BL2 in response to a precharge control signal PRB5 inputted into its gate. Moreover, in the read test in the third exemplary embodiment, a memory cell 11 connected to the bit line pair BL1, BL2 and the word line WL20 that are the same as in the memory cell 10 is used The memory cell 11 is of the same configuration as that of the memory cell 10. Since other configurations are the same as those of the first exemplary embodiment, explanations thereof will be omitted.

(Operations in Test Mode)

Figure 10:
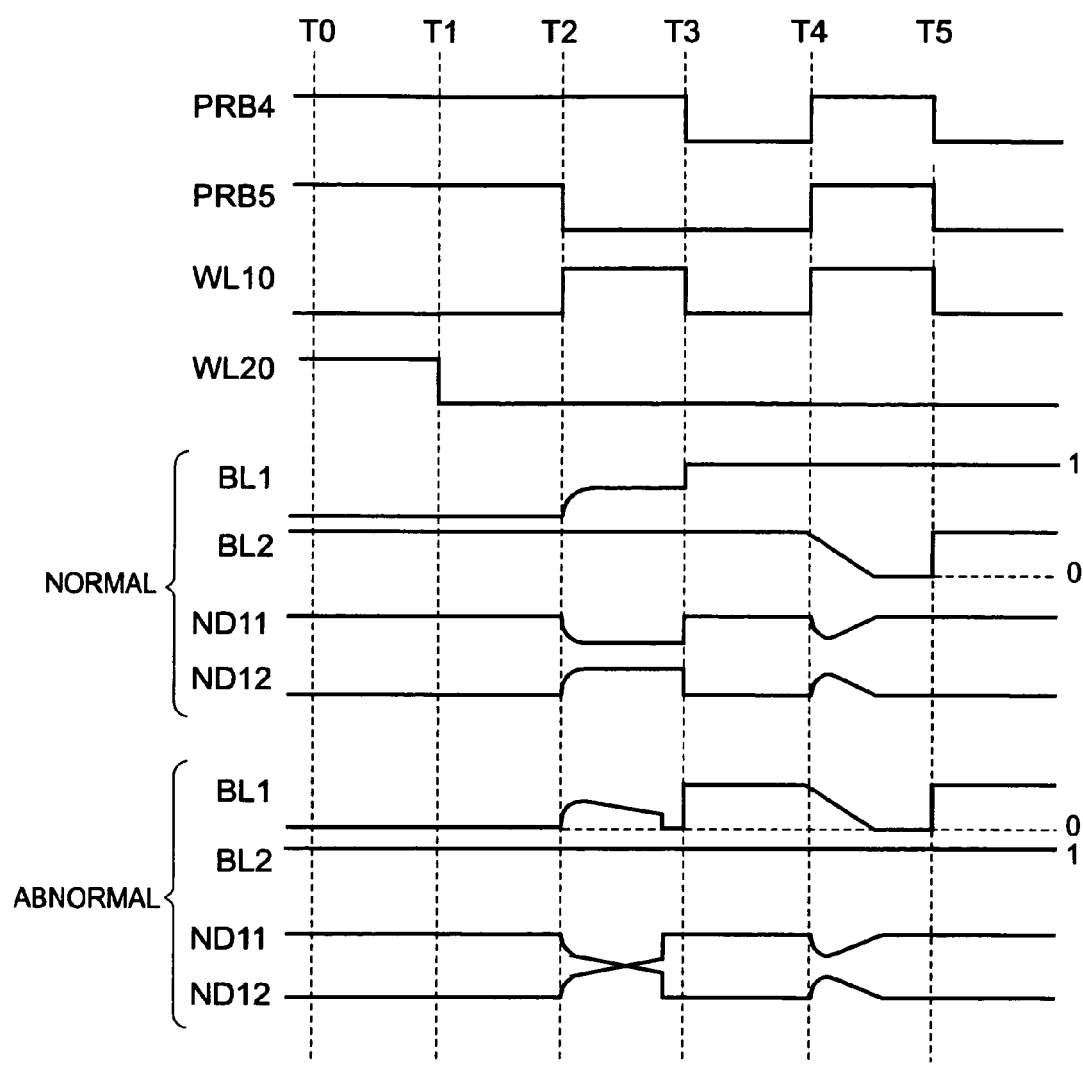
FIG. 10 is a timing chart showing operations of the read test of the SRAM in the third exemplary embodiment.

Details of operations in the third exemplary embodiment of the SRAM in the test mode will be explained with reference to FIG. 10. FIG. 10 is a timing chart showing the operations of the read test of the SRAM in the third exemplary embodiment.

Test operations of this exemplary embodiment are different from those of the first exemplary embodiment from the test start time to time T3, but the operations at the other times are the same. Below, designating the test start time as time T0, only the operations at time T0 to time T3 will be explained, but the operations at the other times will be omitted. Moreover, setting a test target to be the memory cell 10, the explanation will be given. Incidentally, the data shall be written in the memory cells 10, 11 by time T0. Here, pieces of the data written in the memory cell 10 and the memory cell 11 shall be the reverse data (being inverted) to each other. That is, by time T0, the node ND11 of the memory cell 10 has held data "1" (the high level), and the node ND12 has held data "0" (the low level). Moreover, a node ND21 of the memory cell 11 has held data "0" (the low level), and a node ND22 has held data "1" (the high level).

A word line WL20 is activated between time T0 and time T1, and the data is read from the memory cell 11. During this time, the word line WL10 becomes deactivated and the memory cell 10 is not selected. The bit line BL1 is pulled down to the low level by data "0" being read from the memory cell 11 (the node ND21). Moreover, the bit line BL2 becomes the high level because of reading of data "1."

At time T1, the word line WL20 is deactivated and the memory cell 11 is disconnected from the bit line pair BL1, BL2. At this moment, in order that the precharge control signals PRB4, PRB5 may maintain the high level, the bit line pair BL1, BL2 and the first power supply VDD are disconnected. Therefor, the bit line BL2 maintains the low level and the bit line BL1 maintains the high level.

At time T2, the precharge control signal PRB5 shifts to the low level, and the precharge control signal PRB4 maintains the high level. Moreover, the word line WL1 is activated. Thereby, the power supply voltage VDD is fed to the node ND12 from the precharge circuit 20 through the bit line pair BL2. The feed of the voltage to the node ND12 by the precharge circuit 20 is being done until the word line WL10 is deactivated at time T3. That is, between time T2 and time T3, the precharge circuit 20 feeds the power supply voltage to the node ND 12, while intercepting the feed of the power supply voltage to the node ND11. Moreover, since the first power supply VDD and the bit line BL1 are being disconnected by the precharge circuit 20, the power supply voltage VDD is not fed to the node ND11. Furthermore, since the bit line BL1 has been at the low level, the voltage of the node ND11 is pulled down by the bit line BL1.

Between time T2 and time T3, the voltage of the node ND12 is pulled up from the low level "0" by a predetermined voltage by the precharge circuit 20. On the other hand, the voltage of the node ND11 decreases from the high level "1" by a predetermined voltage, since the voltage of the node ND11 is pulled down by the bit line BL1 being at the low level, the voltage of the node ND11 decreases more largely than in the first and second exemplary embodiments. For this reason, between time T2 and time T3 in the third exemplary embodiment, the data becomes a state of being easily inverted than in the first and second exemplary embodiments. That is, the SRAM in the third exemplary embodiment can improve the detection sensitivity of the abnormal memory cell better than the SRAM in the first and second exemplary embodiments.

Moreover, by writing the reverse data (inverted data) of the written data shown in FIG. 10 in the memory cell 10 and performing the read test, it is possible to detect the abnormality of the other element that is not detected by the above-mentioned test. In detail, data "0" is written in the node ND11, data "1" is written in the node ND12, and then the read test is performed. In doing this, data "1" is written in the node ND21, data "0" is written in the node ND12, and a voltage of the bit line BL2 connected to the node ND12 is pulled down by a reading processing at time T1 to time T2. Moreover, from time T2 to time T3, the precharge control signals PRB4, PRB5 whose signal levels are inverted to the signal shown in FIG. 10 are inputted into the precharge circuit 20. Thereby, at time T2 to time T3, the power supply voltage VDD is fed to the node ND 11 holding data "0" from the bit line BL1, and the voltage of the node ND12 is pulled down by the bit line BL2. By doing operations this way, it is possible to detect the abnormality of the other element in the memory cell 10.

In also the SRAM in the third exemplary embodiment, similarly with the first exemplary embodiment, the voltage of the node holding data "0" (the low level) is not pulled up only by the electric charges charged in the bit line capacitance, but is raised (is biased) additionally by the power supply voltage VDD. For this reason, although the SNM is small and the fraction defective is high, it becomes possible to detect (eliminate) the abnormal SRAM that cannot be detected (eliminated) by the read test according to the related technology.

Moreover, similarly with the first exemplary embodiment, a change from the related technology shown in FIG. 1 to the SRAM in the third exemplary embodiment lies only in operations of the precharge control circuit in the test mode (the precharge control signal at time T2 to time T3), addition of a condition in writing the data in the memory cell, and addition of a reading operation. Therefore, it is possible to perform the test capable of detecting the abnormal memory cell whose SNM is small without altering the memory cell and the precharge circuit.

4. Fourth Exemplary Embodiment

Figure 11:
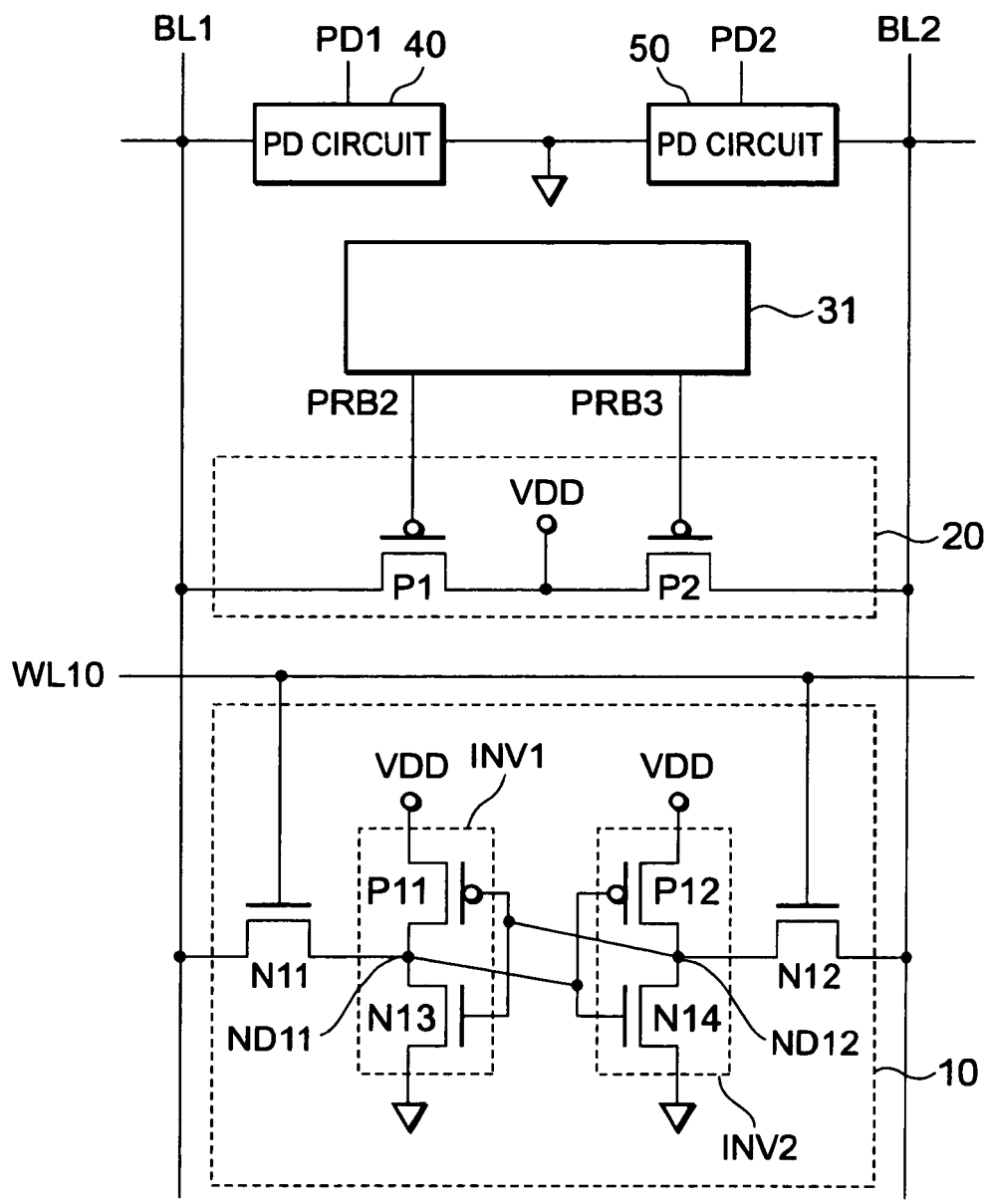
FIG. 11 is a diagram showing a part of a configuration in a fourth exemplary embodiment of the SRAM according to the present invention.

FIG. 11 is a diagram showing a part of a configuration of the SRAM in a fourth exemplary embodiment. In the SRAM in the second exemplary embodiment, at the time of the test mode, the precharge transistors P1, P2 are controlled by the respective precharge control signals PB2, PB3 whose signal levels change at different timings. On the other hand, the SRAM in the fourth exemplary embodiment has a configuration that pull-down circuits 40, 50 are further added to the SRAM in the second exemplary embodiment. The SRAM becomes SRAM whose detection sensitivity of the abnormality is further higher by reducing a voltage of one of the bit line pair with the pull-down circuits 40, 50.

(Configuration of SRAM)

Referring to FIG. 11, the SRAM in the fourth exemplary embodiment include the pull-down circuit 40 connected between the bit line BL1 and the second power supply (GND) and the pull-down circuit 50 connected between the bit line BL2 and the second power supply (GND). Other configurations are the same as the configurations of the SRAM in the second exemplary embodiment. The pull-down circuit 40 pulls down a voltage of the bit line BL1 to a GND level in response to a control signal PD1. The pull-down circuit 50 pulls down the voltage of the bit line BL2 to the GND level in response to a control signal PD2.

Figure 12A:
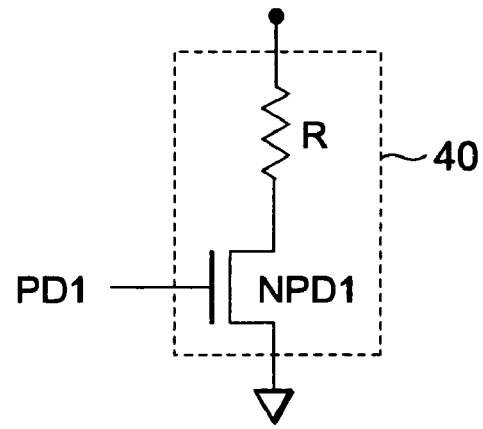
FIG. 12A is a diagram showing one example of a configuration of a pull-down circuit mounted on the SRAM according to the present invention.
Figure 12B:
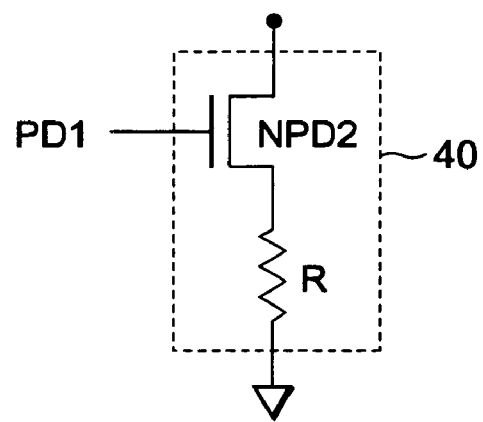
FIG. 12B is a diagram showing one other example of the configuration of the pull-down circuit mounted on the SRAM according to the present invention.
Figure 12C:
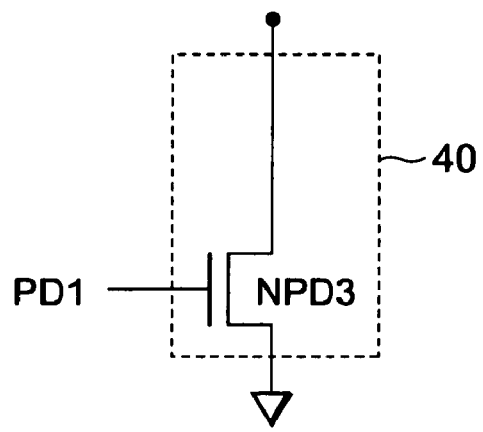
FIG. 12C is a diagram showing a further other example of the configuration of the pull-down circuit mounted on the SRAM according to the present invention.

FIG. 12 is a diagram showing one example of a configuration of the pull-down circuit 40. Incidentally, since the configuration of the pull-down circuit 50 is the same as that of the pull-down circuit 40, an explanation thereof will be omitted. The pull-down circuit 40 includes an N-channel MOS transistor into whose gate the control signal PD1 is inputted. The pull-down circuit 40 shown in FIG. 12A includes an N-channel MOS transistor NPD1 connected between a resistance R and the second power supply (GND). The pull-down circuit 40 shown in FIG. 12B includes an N-channel MOS transistor NPD2 connected to the second power supply (GND) through the resistance R. The pull-down circuit 40 shown in FIG. 12C is equipped only with an N-channel MOS transistor NPD3 connected to the second power supply (GND).

(Operations in Test Mode)

Figure 13:
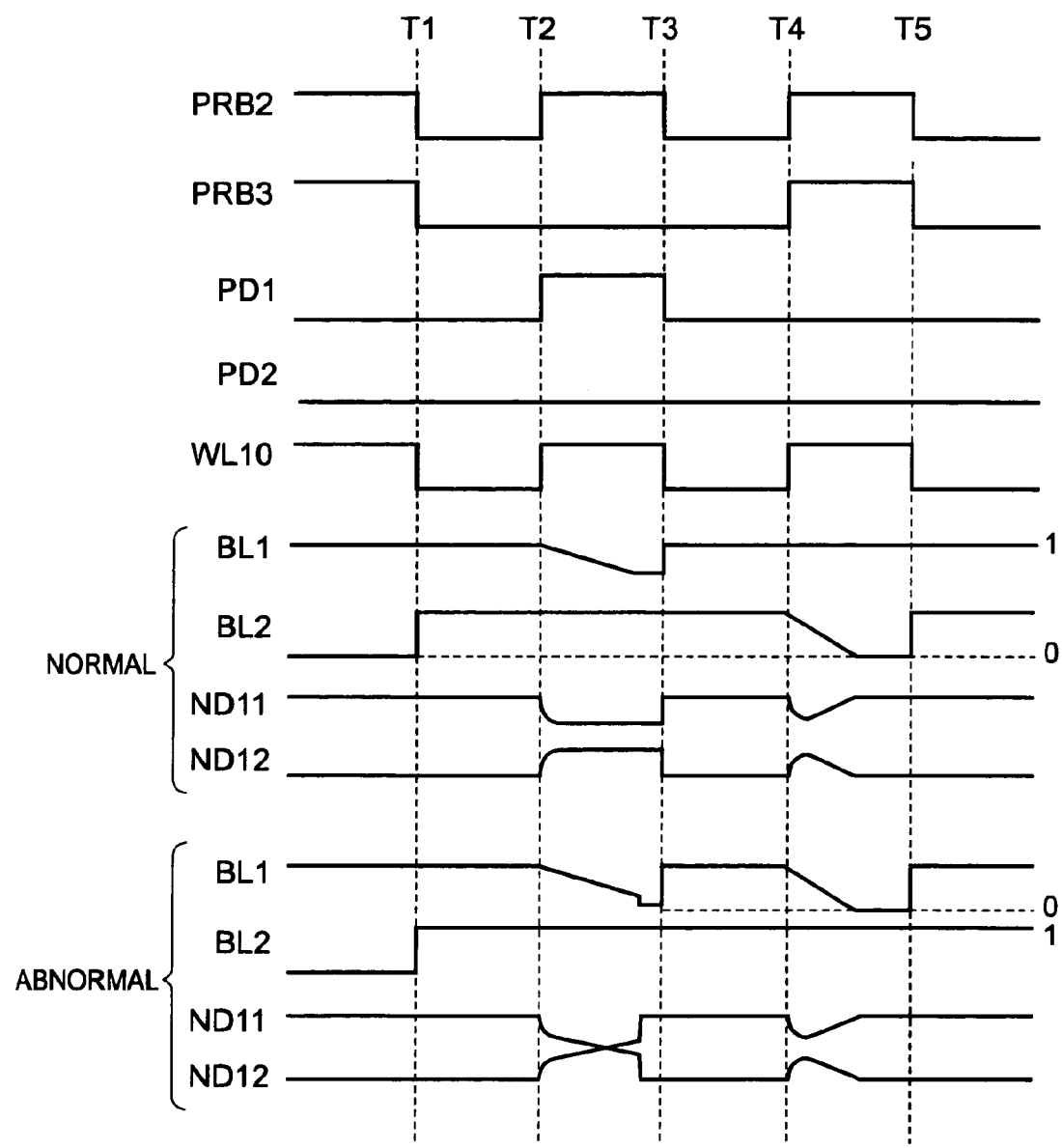
FIG. 13 is a timing chart showing operations of the read test of the SRAM in the fourth exemplary embodiment.

Details of operations in the fourth exemplary embodiment of the SRAM in the test mode will be explained with reference to FIG. 13. FIG. 13 is a timing chart showing the operations of the read test of the SRAM in the fourth exemplary embodiment.

Regarding test operations of this exemplary embodiment, operations of the pull-down circuits 40, 50 are added to the operations in the second exemplary embodiment, and other operations are the same as those of the second exemplary embodiment. From time T2 to time T3, one of the pull-down circuits 40, 50 operates to pull up the voltage of one of the bit line pair BL1, BL2. At the other times, the pull-down circuits 40, 50 do not operate. Only operations from time T2 to time T3 will be explained below, and explanations of operations at the other times will be omitted.

At time T2, the precharge control signal PRB2 shifts to the low level, and the precharge control signal PRB3 maintains the low level. Moreover, the word line WL10 is activated. Thereby, the power supply voltage VDD is fed to the node ND12 from the precharge circuit 20 through the bit line pair BL2. The feed of the voltage to the node ND12 by the precharge circuit 20 is being done until the word line WL10 is deactivated at time T3. That is, between time T2 and time T3, the precharge circuit 20 feeds the power supply voltage to the node ND12 while intercepting the feed of the power supply voltage to the node ND11. Moreover, since the first power supply VDD and the bit line BL1 are being disconnected by the precharge circuit 20, the power supply voltage VDD is not fed to the node ND11. For this reason, electric charges are released from the node ND11 through the bit line BL1. At this time, since the control signal PD1 shifts to the high level, a pull-down circuit PD1 operates to pull down the voltage of the bit line BL1. On the other hand, since the control signal PD2 maintains the low level, a pull-down circuit PD2 does not operate.

Between time T2 and time T3, the voltage of the node ND12 is pulled up by the precharge circuit 20 from the low level "0" only by a predetermined voltage. On the other hand, although the voltage of the node ND11 decreases from the high level "1" only by a predetermined voltage, since the precharge circuit 20 does not pull up the voltage of the node ND11, the voltage of the node ND11 decreases more largely than that of the first exemplary embodiment. Furthermore, in this exemplary embodiment, the voltage of the node ND11 is pulled down by the pull-down circuit 40. For this reason, between time T2 and time T3 in the second exemplary embodiment, the data becomes a state of being easily inverted than in the first and second exemplary embodiments. That is, the SRAM in the fourth exemplary embodiment can improve the detection sensitivity of the abnormal memory cell better than the SRAM in the first and second exemplary embodiments.

Moreover, by writing the reverse data (inverted data) of the written data shown in FIG. 13 in the memory cell 10 and by performing the read test, it is possible to detect the abnormality of the other element that is not detected by the above-mentioned test. In detail, data "0" is written in the node ND11, data "1" is written in the node ND12, and then the read test is performed. Moreover, from time T2 to time T3, the precharge control signals PRB4, PRB5 whose signal levels are inverted to the signal shown in FIG. 10 are inputted into the precharge circuit 20. In this period, a voltage of the node ND12 is further pulled down by the pull-down circuit 50.

Thereby, from the time T2 to time T3, the power supply voltage VDD is fed to the node ND11 holding data "0" from the bit line BL1, and the voltage of the node ND12 is pulled down by the pull-down circuit 50. By doing the operations this way, it is possible to detect the abnormalities of the other element in the memory cell 10.

In also the SRAM in the fourth exemplary embodiment, similarly with the first exemplary embodiment, the voltage of the node holding data "0" (the low level) is not pulled up only by the electric charges charged in the bit line capacitance, but is raised additionally by the power supply voltage VDD. For this reason, although the SNM is small and the fraction defective is high, it becomes possible to detect (eliminate) the abnormal SRAM that cannot be detected (eliminated) by the read test according to the related technology.

Moreover, a change from the related technology shown in FIG. 1 to the SRAM in the fourth exemplary embodiment lies in operations (the precharge control signal at time T2 to time T3) and addition of the pull-down circuits 40, 50. The pull-down circuits 40, 50 that are added have small areas as shown in FIG. 12. Therefore, according to the SRAM in this exemplary embodiment, it is possible to perform the test capable of detecting the abnormal memory cell whose SNM is small without increasing the chip area largely.

Furthermore, it is possible to arbitrarily set up a range (characteristic) of the abnormal memory cell that is intended to be detected by altering a value of the resistance R used for the pull-down circuits 40, 50. However, if a resistant value of the resistance R is set below a predetermined value, then the data will be inverted even in the case of the normal memory cell, which will cause an incorrect determination. For this reason, it is necessary to set a magnitude of the resistance R to be larger than the resistant values of the P-channel MOS transistors P11, P12 in the memory cell 10.

5. Fifth Exemplary Embodiment

A fifth exemplary embodiment of SRAM and a read test method of the SRAM according to the present invention will be described with reference to FIG. 14.

(Configuration of SRAM)

Figure 14:
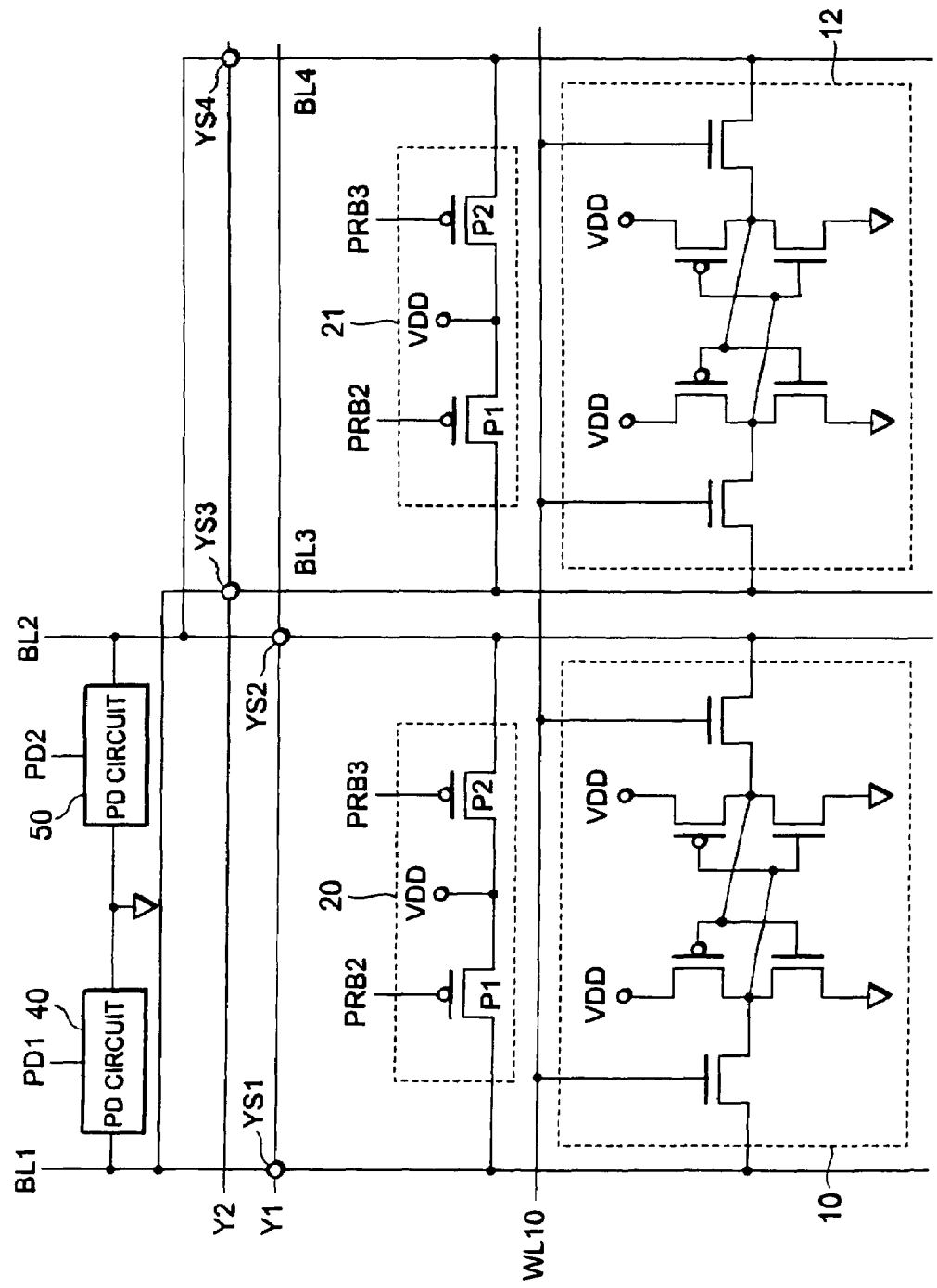
FIG. 14 is a diagram showing a part of a configuration of a fifth exemplary embodiment of the SRAM according to the present invention.

Although the pull-down circuits 40, 50 in the fourth exemplary embodiment may be formed for every bit line pair, they may be provided commonly for a plurality of bit line pairs, as shown in FIG. 14. In this case, the pull-down circuits 40, 50 are connected to the bit lines, respectively, through Y selectors. The Y selector determines a connection destination of the pull-down circuit 40, 50 in response to a select signal being inputted.

In detail, the SRAM in the fifth exemplary embodiment includes a memory cell 12 that is connected to an other bit line pair BL3, BL4 and a precharge circuit 21, in addition to the SRAM in the fourth exemplary embodiment. Moreover, the pull-down circuits 40, 50 are connected to the bit line pair BL1, BL2 (the memory cell 10 and the precharge circuit 20) through the selectors YS1, YS2, and is connected to the bit line pair BL3, BL4 (the memory cell 12 and the precharge circuit 21) through the selectors YS3, TS4. The selectors YS1, YS2 electrically connect the bit line pair BL1, BL2 to the pull-down circuits 40, 50, respectively, in response to the select signal Y1. The selectors YS3, YS4 electrically connect the bit line pair BL3, BL4, to the pull-down circuits 40, 50, respectively, in response to the select signal Y2.

The pull-down circuits 40, 50 are connected to the memory cell that becomes the test target by the Y selectors, and the read test is performed by the same method as that of the fourth exemplary embodiment. Since details of operations are the same as those of the fourth exemplary embodiment, explanations thereof will be omitted. Incidentally, the read test in which the plural memory cells are designated as the test targets may be performed.

In the fifth exemplary embodiment, since it is not necessary to provide the pull-down circuit for every bit line pair, it becomes also possible to reduce a chip area, in addition to the effect shown in the fourth exemplary embodiment.

As in the above, in the read test of the SRAM according to the present invention, a processing that forcibly inverts the data of the memory cell whose SNM is small by biasing the voltage of the node in which data "0" (the low level) is written with an existing precharge circuit is performed. Thereby, it becomes possible to detect the abnormal memory cell whose SNM is small and that is not detected by the normal read test. Moreover, since the voltage of the node is pulled up using the existing precharge circuit, it is possible to improve the detection sensitivity without increasing the circuit area.

In the foregoing, although the exemplary embodiments of the present invention were explained in detail, a concrete configuration is not restricted to the above-mentioned exemplary embodiments, and if any one of the exemplary embodiments is altered within a scope that does not deviate from the gist of the present invention, then it is included in the present invention. Moreover, any of the third to fifth exemplary embodiments may be combined so as to fall within a scope that causes no problem technologically.

Further, it is noted that Applicant's intent is to encompass equivalents of all claim elements, even if amended later during prosecution.

What is claimed is:

1. A static random access memory (SRAM), comprising:
   a memory cell including a node pair; and
   a precharge circuit which precharges a bit line pair with a power supply voltage before writing a data in the memory cell or before reading a data therefrom at a normal mode, and which feeds the power supply voltage to at least a low level data-holding node of the node pair at a time of a read test mode, between time for writing a data in the memory cell and time for reading a data therefrom,
   wherein one node of said node pair is connected to one bit line of the bit line pair by activation of a word line, the other node of said node pair is connected to the other bit line of the bit line pair by activation of the word line.

2. The SRAM according to claim 1, wherein at the time of the read test, between the time for writing the data in the memory cell and the time for reading the data therefrom, the precharge circuit cuts off a connection between a bit line of the bit line pair electrically connected to a high level data-written node of the node pair and a power supply.

3. The SRAM according to claim 1, wherein the memory cell comprises a first memory cell, the SRAM further comprising:
   a second memory cell connected to the bit line pair, wherein at the time of the read test, the second memory cell holds an inverted data of the data written in the first memory cell, and the precharge circuit feeds the power supply voltage to a low level holding node of the node pair after the inverted data was read from the second memory cell.

4. The SRAM according to claim 1, further comprising:
   a pull-down circuit which pulls down a voltage of a bit line being electrically connected to a high level data-written node among the bit line pair.

5. The SRAM according to claim 4, wherein the bit line pair comprises a first bit line pair, the SRAM further comprising:
a second bit line pair connected to the pull-down circuit so that the pull-down circuit pulls down a voltage of a bit line electrically connected to a high level data-written node among the second bit line pair.

6. The SRAM according to claim 1, wherein at the time of the read test, between the time for writing the data in the memory cell and the time for reading the data therefrom, the precharge circuit feeds the power supply voltage to the node pair.

7. The SRAM according to claim 1, wherein the memory cell includes a pair of invertors, output of one of the pair of invertors is connected to input of the other of the pair of invertors, and output of the other of the pair of invertors is connected to input of the one of the pair of invertors,
wherein said node pair comprises said outputs of the pair of invertors.

8. A method of testing a static random access memory (SRAM), the method comprising:
writing a data in a node pair of a memory cell;
feeding a power supply voltage to at least a low level data-written node of the node pair, by a precharge circuit, at a time of a test mode;
halting the feeding of the power supply voltage and reading the data from the memory cell; and
determining whether the memory cell is defective or not by comparing the data read and the data written.

9. The method according to claim 8, when the power supply voltage is fed, the precharge circuit halts feeding the power supply voltage to a high level data-written node of the node pair.

10. The method according to claim 9, further comprising:
before the feeding of the power supply voltage, reading an inverted data from the node pair of another memory cell connected to a bit line connected to the memory cell.

11. The method according to claim 8, wherein a pull-down circuit pulls down a voltage of a bit line connected to a high level data-written node of the node pair during when the precharge circuit feeds the power supply voltage.

12. The method according to claim 8, wherein the precharge circuit feeds the power supply voltage to the node pair when the feeding of the power supply voltage.

13. A static random access memory (SRAM), comprising:
a memory cell including a node pair; and
a precharge circuit which precharges a bit line pair with a power supply voltage at a time of precharge in a first mode by a control signal, and which feeds the power supply voltage to at least a node of the node pair at a second mode by the control signal,
wherein one node of said node pair is connected to one bit line of the bit line pair by activation of a word line, the other node of said node pair and being connected to the other bit line of the bit line pair by activation of the word line,
wherein the control signal is outputted according to another control signal at the second mode different from at the first mode.

* * * * *